(12) United States Patent
Wu et al.

(10) Patent No.: US 7,277,165 B2
(45) Date of Patent: Oct. 2, 2007

(54) METHOD OF CHARACTERIZING FLARE

(75) Inventors: Bo Wu, San Jose, CA (US);
Abdurrahman Sezginer, Los Gatos, CA (US)

(73) Assignee: Invarium, Inc., San Jose, CA (US)

( * ) Notice: Subject to any disclaimer, the term of this patent is extended or adjusted under 35 U.S.C. 154(b) by 355 days.

(21) Appl. No.: 10/860,853

(22) Filed: Jun. 4, 2004

(65) Prior Publication Data

US 2005/0270523 A1     Dec. 8, 2005

(51) Int. Cl.
*G01N 21/00* (2006.01)
(52) U.S. Cl. .................................................. 356/237.5
(58) Field of Classification Search ............... None
See application file for complete search history.

(56) References Cited

U.S. PATENT DOCUMENTS

2004/0196447 A1 * 10/2004 Watanabe .................... 355/77

OTHER PUBLICATIONS

Flagello, Donis G.; Socha, Robert; Shi, Zuelong; van Schoot, Jan; Baselmans, Jan, van Kerkhof, Mark; de Boeij, Wim; Engelen, Andre; Carpaij, Rene; Noordman, Oscar; Moers, Marco; Mulder, Melchoir; Finders, Jo; van Greevenbroek, Henk; Schriever, Martin; Maul, Manfred; Haidner, Helmut; Goeppert, Markus; Wegmann, Ulrich; Graeupner, Paul, "Optimizing and Enhancing Optical Systems to Meet the Los $k_1$ Challenge," Optical Microlithography XVI, Proceedings of SPIE vol. 5040 (2003) pp. 139-150.

Otsuka, Takahisa; Sakamoto, Kazuo, "CD Error Budget Analysis in ArF Lithography," Data Analysis and Modeling for Process Control, Proceedings of SPIE vol. 5378 (2004) pp. 160-171.

Futatsuya, Hiroki; Yao, Teruyoshi; Osawa, Morimi; Ogino, Kozo; Hoshino, Hiromi; Arimoto, Hiroshi; Machida, Yasuhide and Asai, Satoru, "Model-Based OPC/DRC Considering Local Flare Effects," Optical Microlithography XVII, Proceedings of SPIE Vo. 5377 (2004) pp. 451-458.

Emmanuelle Luce, Blandine Minghetti, Patrick Schiavone, Olivier Toublan and Andre P. Weill, "Flare Impact on the Intrafield CD Control for Sub-0.25-μm Patterning," Proc. SPIE vol. 3679, *Optical Microlithography XII*, Jul. 1999, p. 368-381.

(Continued)

*Primary Examiner*—Michael P. Stafira
(74) *Attorney, Agent, or Firm*—John Smith-Hill; Smith-Hill and Bedell

(57) ABSTRACT

A method of measuring flare in an optical lithographic system utilizes an exposure mask with first and second discrete opaque features each having rotational symmetry of order greater than four and of different respective areas. The exposure mask is positioned in the lithographic system such that actinic radiation emitted by the lithographic system illuminates the sensitive surface of an exposure target through the exposure mask. The extent to which regions of the sensitive surface that are within the geometric image of a feature of the exposure mask are exposed to actinic radiation during due to flare is measured.

42 Claims, 5 Drawing Sheets

OTHER PUBLICATIONS

G. Golub and van Loan, *Matrix Computations*, Chapter 2, John Hopkins University Press, 1996.

M. Griddata, "MATLAB Function Reference," The Math Works, Inc., Natick, Massachusetts, 2002.

Chan et al, "High-Resolution Maskless Lithography," *Journal of Microlithography, Microfabrication and Microsystems 02 (04)*, 2003, p. 331-339.

Kirk, Joseph P., "Scattered Light in Photolithographic Lenses," Proceedings of SPIE vol. 2197 (1994) pp. 566-572.

Renwick, Stephen P., "Flare and its Effects on Imaging," Nikon Precision, Inc., Belmont, California, Proceedings of SPIE vol. 5377 (2004) pp. 442-450.

van de Kerkhof, Mark; de Boeij, Wim; Kok, Haico; Silova, Marianna; Baselmans, Jan; Hemerik, Marcel, "Full Optical Column Characterization of DUV Lithographic Projection Tools," Proceedings of SPIE vol. 5377 (2004) pp. 1960-1970.

Flagello, Donis G.; Socha, Robert; Shi, Zuelong; van Schoot, Jan; Baselmans, Jan, van Kerkhof, Mark; de Boeij, Wim; Engelen, Andre; Carpaij, Rene; Noordman, Oscar; Moers, Marco; Mulder, Melchoir; Finders, Jo; van Greevenbroek, Henk; Schriever, Martin; Maul, Manfred; Haidner, Helmut; Goeppert, Markus; Wegmann, Ulrich; Graeupner, Paul, "Optimizing and Enhancing Optical Systems to Meet the Los $k_1$ Challenge," Optical Microlithography XVI, Proceedings of SPIE vol. 5040 (2003) pp. 139-150.

Matsuyama, Tomoyuki; Ishiyama, Toshiro; Ohmura, Yasuhiro, "Nikon Projection Lens Update," Proceedings of SPIE vol. 5377 (2004) pp. 730-741.

Otsuka, Takahisa; Sakamoto, Kazuo, "CD Error Budget Analysis in ArF Lithography," Data Analysis and Modeling for Process Control, Proceedings of SPIE vol. 5378 (2004) pp. 160-171.

Futatsuya, Hiroki; Yao, Teruyoshi; Osawa, Morimi; Ogino, Kozo; Hoshino, Hiromi; Arimoto, Hiroshi; Machida, Yasuhide and Asai, Satoru, "Model-Based OPC/DRC Considering Local Flare Effects," Optical Microlithography XVII, Proceedings of SPIE Vo. 5377 (2004) pp. 451-458.

* cited by examiner

METHOD OF CHARACTERIZING FLARE

BACKGROUND OF THE INVENTION

A conventional optical lithographic stepper system, for imagewise exposure of a coating of resist on a semiconductor wafer, includes a light source for emitting a beam of actinic radiation directed towards the wafer, an imaging lens for imaging the light source on an exposure mask (also called a reticle) that defines features that are to be transferred from the mask to the resist coating, and a projection lens for imaging the mask on the resist coating. Ideally, every point of the mask is either opaque or transparent and, subject to diffraction limitations, the lithographic system results in the resist coating being exposed in regions that correspond to transparent regions of the mask and being unexposed in regions that correspond to opaque regions of the mask. The resist is then developed, leaving a pattern of resist features that corresponds to the pattern of opaque features of the exposure mask (in the case of a positive resist), and the underlying wafer is selectively etched using the patterned resist to protect the wafer. FIG. 1 illustrates this ideal mode of operation. As shown in FIG. 1, resist features 4 are images of mask features 2. For simplicity, projection optics between the mask and the wafer, and the image reduction effected by the projection optics are not shown in FIG. 1.

In operation, the optical lithographic stepper system effects stepwise relative movement of the exposure mask and wafer transverse to the axis of the system so that different sites or fields of the wafer can be exposed through the mask. A field or "image field" is a region that is exposed without moving the wafer or the mask with respect to the lens; or in the case of a stepper-scanner instrument, a field is a region that is exposed in one, linear, continuous scanning motion of the wafer and mask stages. Stepper-scanners project a slit-shaped region, typically 26 mm by 8 mm, on the image plane (wafer). A field is exposed by scanning the slit shaped image in a direction that is parallel to its short dimension. The maximum field size on the order of 26 mm by 33 mm.

All imaging systems suffer from some amount of flare (an effect that mixes light from one part of the image with light from another part). Referring to FIG. 2, flare results in the resist features 4' being an imperfect match for the mask features 2. Flare degrades system performance, causes CD (critical dimension) variation, and decreases process latitude. Flare may be caused by particles or irregular films deposited on optical components, surface roughness caused by grinding lens and mirror elements, density variations in lens blanks, birefringence of lenses, imperfect antireflection coatings, imperfect absorbing coating on the lens mounts and lens barrel, multiple reflections between the wafer and the mask, multiple reflections between the wafer and the lens elements, among other factors.

Referring to FIG. 2, light that is issued from point O on the mask is imaged to point O' on wafer 6. In the absence of flare, the intensity at O' would be $I_0$. In the presence of flare, a portion $I_0 g(r) dA$ of the intensity is misdirected to point O" from an infinitesimal neighborhood of O' of area dA.

The function $g(r)$ is referred to herein as the aggregate flare density function (or aggregate flare point spread function). The flare density function depends on the distance $r=|O'O"|$ between the source and observation points. Measurements that have been made indicate that the aggregate flare density function decreases monotonically from a peak value as r increases.

Because flare represents imperfect behavior of an optical lithographic system, it is desirable to reduce the flare of the projection optics by good optics design and maintenance. However, some residual flare is inevitable even in the highest quality optics. The remaining flare can be managed by taking flare into account in the design of the mask. The patterns on the mask can be compensated for flare and other optical imperfections. Compensating the mask for flare requires the knowledge of the flare density function.

Some prior art measure flare in an optical lithographic stepper system by using a photoresist detector 5. Such a detector comprises a wafer 6 or other substrate having a coating of photoresist 7 on one surface. The photoresist is exposed in the stepper system using a test structure as an exposure mask and is subsequently developed. Either the presence or the dimensions of features of the mask, as transferred to the photoresist, are measured and these measurements are used to characterize the flare of the stepper system.

FIG. 3 illustrates a photoresist detector 5 and a reticle 12 that is transparent except for an opaque feature 14 of width W. Different sites on the photoresist detector are exposed through the reticle at several progressively increasing doses. By exposing the detector at different sites at different exposure doses, we can determine the dose that is sufficient to clear the photoresist at locations remote from the opaque feature 14 (projected to wafer level) and the dose that is required in order to clear the resist within the geometric image of the opaque feature 14. Geometric image means: the image of an object that would form in the absence of flare and diffraction. It is a hypothetical image of the object that is obtained by ray tracing. Let us assume that an exposure dose $D_0$ is just sufficient to clear the resist at locations that are remote from opaque reticle features. If there were no flare, the region within the geometric image of the feature 14 would remain unexposed (except for diffraction and aberration effects) regardless of dose. Due to flare, however, some proportion of the light from transparent regions of the reticle reaches the detector within the geometric image of the opaque feature 14. If the dose required to clear the geometric image of the feature 14 is $D_1$, we can define the flare level F at a distance W/2 from a linear boundary of an opaque feature by the ratio $D_0:D_1$.

Flagello, D. et al., "Optimizing and Enhancing Optical Systems to Meet the Low $k_1$ Challenge", Proc. SPIE, vol. 5040, pp 139-150 (2003), discloses that scattered light in an optical lithography system may be measured using a reticle that is transparent except for opaque square pads of several different sizes. A photoresist detector is exposed through the reticle at several progressively increasing doses. The minimum exposure dose to clear each pad is determined.

Kirk, J. P., "Scattered Light in Photolithographic Lenses", Proc. SPIE Vol. 2197, p. 566-572 (1994), discloses that flare may be measured by observing the extent to which an edge of the unexposed photoresist has receded from the corresponding edge of the geometric image of an opaque feature.

Prior art that measure flare by exposing a photoresist assume a functional form of the flare density function. A Gaussian density function is frequently assumed. The functional form of the density function is not directly obtained from the measurements.

High-order wavefront aberrations contribute significantly to total flare. Matsuyama, T. et al., "Nikon Projection Lens Update", SPIE 2004, and M. Kerkhof et al., "Full Optical Column Characterization of DUV Lithographic Projection Tools", SPIE 2004, disclose using an interferometer to measure these aberrations. High-order wavefront aberrations only yield short-range flare.

Conventional methods of measuring flare measure only the aggregate flare. Optimal management of flare would require information regarding the distinct characteristics of short, medium-range (field-scale) flare, and long-range (wafer-scale) flare, respectively.

Flare may also be asymmetrical with regard to both location in the field and angle of incidence on the wafer. For example, the flare may be higher at the left of the field than at the right; and at a given point of the field flare incident from the right may be stronger than the flare incident from the left; and flare may scatter preferentially in one direction causing the point spread function to be not circularly symmetric. Priort art described above do not permit characterization of asymmetry of flare.

SUMMARY OF THE INVENTION

An object of the present invention is to characterize flare in an imaging system without presupposing the functional form of the density (point-spread) function of the flare.

Another objective of the invention is to characterize the dependence of the flare density function on the position of the source point in the image field.

Another objective of the invention is to measure components of flare corresponding to different ranges of influence. Each observation of flare can be influenced by multiple such components. Two methods are provided to extract the flare density functions of multiple components from measurements influenced by multiple flare components.

Another objective of the invention is to characterize asymmetry in the flare density function.

The invention provides a method of measuring the flare density function using a test pattern with opaque features of various diameters and shapes that have a rotational symmetry of order greater than four, such as circles and octagons. In an embodiment, the pads have a hole in their center for discerning the asymmetry of the flared image.

The invention provides an alternative embodiment in which the critical dimension changes are used as a flaremeter. A method of calibrating critical dimension changes to read flare intensity is provided.

The invention provides an alternative embodiment in which the flare density function is obtained from flared images of a pinhole recorded by a photoresist, a photodetector or an array of photodetectors.

Accordingly, in accordance with a first aspect of the invention there is provided a method of measuring flare in an optical lithographic system having a source that emits actinic radiation, comprising a. providing an exposure mask that comprises at least first and second discrete features of a first opacity characteristic in a field of a second opacity characteristic, wherein the first and second features each have rotational symmetry of order greater than four and are of different respective areas, the first opacity characteristic is substantially complete opacity and the second opacity characteristic is substantially complete transparency, b. providing an exposure target having a surface that is sensitive to actinic radiation, c. positioning the exposure mask and the exposure target in the lithographic system such that actinic radiation emitted by the lithographic system illuminates the sensitive surface of the exposure target through the exposure mask, whereby each feature of the exposure mask projects a geometric image on the sensitive surface of the exposure target, d. employing the optical lithographic system to emit a dose of actinic radiation, and e. measuring the extent to which regions of the sensitive surface that are within the geometric image of a feature of the exposure mask are exposed to actinic radiation during step d due to flare.

In accordance with a second aspect of the invention there is provided a method of measuring flare in an optical lithographic system that is subject to first and second species of flare, having first and second different influence ranges respectively, wherein the first influence range is greater than the second influence range, said method comprising a. measuring flare at a first distance that is less than the second influence range, whereby the flare that is measured in step a includes both the first and second species of flare, b. measuring flare at a plurality of distances that are greater than the second influence range, whereby the flare that is measured in step b does not include the second species of flare, and c. calculating a function that characterizes the first species over a range of distances greater than the second influence range, d. employing said function to calculate a value of flare due to the first species for said first distance, e. subtracting the value of flare calculated in step d from the value measured in step a.

In accordance with a third aspect of the invention there is provided a method of measuring flare asymmetry in an optical lithographic system having a source that emits actinic radiation, comprising a. providing an exposure mask that comprises an opaque pad in a transparent field, wherein the pad has rotational symmetry of order greater than four, b. providing an exposure target having a surface that is sensitive to actinic radiation, c. positioning the exposure mask and the exposure target in the lithographic system such that actinic radiation emitted by the lithographic system illuminates the sensitive surface of the exposure target through the exposure mask, whereby the opaque pad of the exposure mask projects a geometric image on the sensitive surface of the exposure target, d. employing the optical lithographic system to emit a dose of actinic radiation, and e. measuring the extent to which regions of the sensitive surface that are within the geometric image of the pad of the exposure mask and are exposed to actinic radiation during step d are asymmetrically positioned relative to the geometric image of the pad.

In accordance with a fourth aspect of the invention there is provided a method of characterizing flare in an optical lithographic system having a source that emits actinic radiation, comprising a. providing an exposure target having a surface that is sensitive to actinic radiation, b. positioning the exposure target in the lithographic system, wherein the lithographic system resolves the sensitive surface of the exposure target into M+N exposure fields, and c. blanketwise exposing N exposure fields on the photosensitive surface of the exposure target to a dose of actinic radiation.

In accordance with a fifth aspect of the invention there is provided a method of measuring flare in a projection lithography system that emits actinic radiation, comprising a. providing a first calibration wafer having a surface that is sensitive to actinic radiation, b. providing an exposure mask that defines pattern features, c. imagewise exposing the fields of the calibration wafer, d. applying a second, blanketwise exposure to some of the fields of the calibration wafer, wherein the blanket exposure has different doses in at least two fields, e. developing the image formed on the wafer, f. measuring a critical dimension of a feature in at least two fields that received blanket exposures of distinct doses, g. measuring the critical dimension of said feature in a reference field that did not receive a blanket exposure in step d, and h. extracting a calibration table, curve, or function that relates changes in critical dimension to flare intensity.

In accordance with a sixth aspect of the invention there is provided a method of characterizing flare in an optical lithographic system that emits actinic radiation, comprising a. providing a first exposure target having a surface that is sensitive to actinic radiation, b. providing an exposure mask that defines pattern features, c. imagewise exposing first, second, third and fourth exposure sites of the first exposure target through the exposure mask to actinic radiation emitted by the lithographic system, whereby the pattern features of the exposure mask project respective geometric images at said first, second, third and fourth sites, d. blanketwise exposing the second and fourth sites of the first exposure target to actinic radiation emitted by the lithographic system at different respective doses, e. measuring critical dimensions of the patterns recorded at the first, second, third and fourth sites, f. providing a second exposure target having a surface that is sensitive to actinic radiation, g. imagewise exposing first and second exposure sites of the second exposure target through the exposure mask to actinic radiation emitted by the lithographic system, whereby the pattern features of the exposure mask project respective geometric images at said first and second sites of the second exposure target, h. blanketwise exposing a third exposure site of the second exposure target to actinic radiation emitted by the lithographic system, wherein the third site of the second exposure target is at substantially a maximum possible distance from the second site, and i. measuring critical dimensions of the patterns recorded at the first and second sites of the second exposure target.

In accordance with a seventh aspect of the invention there is provided a method of characterizing flare in an optical lithographic system that emits actinic radiation, comprising a. providing a first exposure target having a surface that is sensitive to actinic radiation, b. providing an exposure mask that defines pattern features, c. imagewise exposing first, second, third and fourth exposure sites of the first exposure target through the exposure mask to actinic radiation emitted by the lithographic system, whereby the pattern features of the exposure mask project respective geometric images at said first, second, third and fourth sites, d. blanketwise exposing the second and fourth sites of the first exposure target to actinic radiation emitted by the lithographic system at different respective doses, e. measuring critical dimensions of the patterns recorded at the first, second, third and fourth sites, f. providing a second exposure target having a surface that is sensitive to actinic radiation, g. imagewise exposing a first exposure site of the second exposure target through the exposure mask to actinic radiation emitted by the lithographic system, whereby the pattern features of the exposure mask project a geometric image at said first site of the second exposure target, h. blanketwise exposing the second exposure site of the second exposure target to actinic radiation emitted by the lithographic system, i. measuring critical dimensions of the pattern recorded at the first site of the second exposure target, j. providing a third exposure target, k. imagewise exposing a first exposure site of the third exposure target through the exposure mask to actinic radiation emitted by the lithographic system, whereby the pattern features of the exposure mask project a geometric image at said first exposure site of the third exposure target, wherein the first exposure site of the third exposure target corresponds in position to the first exposure site of the second exposure target, and l. measuring critical dimensions of the pattern recorded at the first exposure site of the third exposure target.

In accordance with an eighth aspect of the invention there is provided a method of measuring flare of a species having a selected influence range in an optical lithographic system having a source that emits actinic radiation, comprising a. providing an exposure mask that comprises a substantially opaque field formed with a substantially transparent opening, wherein the opening is smaller than said selected influence range, b. providing an exposure target having a surface that is sensitive to actinic radiation, c. positioning the exposure mask and the exposure target in the lithographic system such that actinic radiation emitted by the lithographic system illuminates the sensitive surface of the exposure target through the exposure mask, whereby the opening projects a geometric image on the sensitive surface of the exposure target, d. employing the optical lithographic system to emit a dose of actinic radiation, and e. measuring the extent to which regions of the sensitive surface that are outside the geometric image of the opening are exposed to actinic radiation during step d due to flare.

In accordance with a ninth aspect of the invention there is provided an improved method of applying optical lithography techniques to a semiconductor device fabrication method in which a mask layout is made based on a circuit design and design rules and the mask layout is printed at an exposure field of a semiconductor wafer by exposing the field to actinic radiation through a mask embodying the mask layout, the improvement comprising a. characterizing the flare characteristic of an optical lithographic system to create an exposure field location dependent flare model for the lithographic system, and b. correcting features of the mask layout in accordance with the predictions of the flare model for the corresponding location of the exposure field.

BRIEF DESCRIPTION OF THE DRAWINGS

For a better understanding of the invention, and to show how the same may be carried into effect, reference will now be made, by way of example, to the accompanying drawings, in which.

Several Figures illustrate features at both wafer level and mask level. In a real lithographic system, which is usually 4× demagnification, mask features are four times as large as the corresponding resist features on the wafer. It will therefore be appreciated that in the Figures that illustrate both wafer level features and mask level features, the wafer level features are illustrated at one fourth the horizontal scale of mask level features.

DETAILED DESCRIPTION

Flare may be characterized by reference to influence range. For the purpose of this patent application, we define short-range flare as flare that has an influence range less than 350 μm from the source, medium-range flare as flare that has an influence range between about 10 mm and 40 mm from the source, and long-range flare as having an influence range greater than 40 mm from the source. Flare-meter based on disappearing resist pads Referring to FIGS. 4 and 5, a test structure 18 that may be used to characterize flare by a first method embodying the present invention comprises a transparent plate 20 and several opaque pads 22 adhered to the plate 20. The pads 22 are typically made by etching a thin film of chromium that is deposited on a fused silica plate. The pads are preferably circular and their diameters range from 4 μm to 400 μm (wafer scale).

In other implementations, such as in extreme ultraviolet (EUV) lithography, plate 20 is reflective and the pads 22 are patterned out of an absorbing film that is deposited on the reflective plate 20. Alternatively, the pads are made by removing parts of a reflective coating on plate 20.

Figure 5:
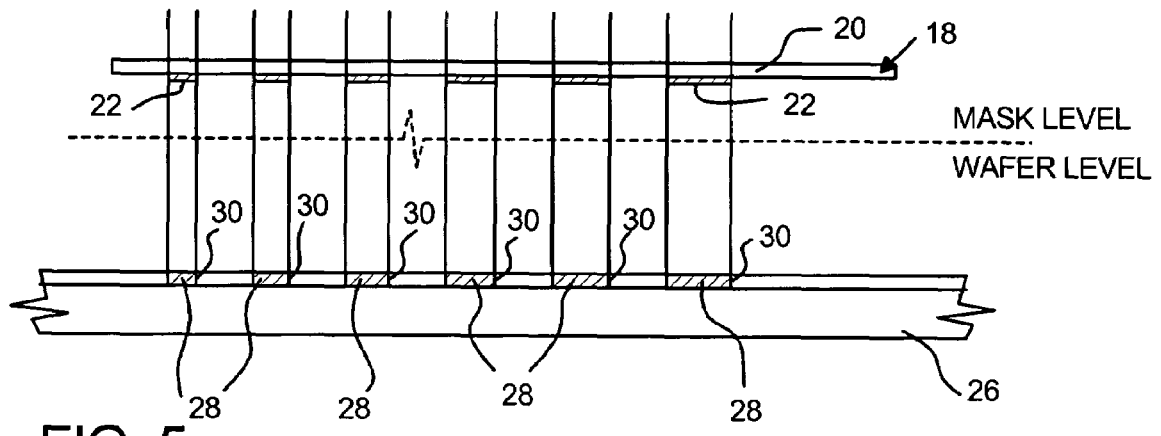
FIG. 5 illustrates, in cross section view, the test structure of FIG. 4 installed in a stepper.

The pads are at least 350 μm apart (wafer scale) so that a given pad will not affect the short-range flare received within the geometric image of an adjacent pad. The test structure is installed in an otherwise conventional optical photolithography stepper system and the stepper system exposes numerous sites on a positive photoresist detector 26 (FIG. 5) through the test structure, thus projecting an image of the test structure at each site. The exposure dose varies from site to site. The photoresist detector is then developed and the radius of each resist pad is measured. At the exposure dose $D_0$ that is just sufficient to clear an area of the resist that corresponds to a transparent area of the test structure, a resist pad 28 remains for each of the opaque pads 22 of the mask, as shown in FIG. 5. As the dose level increases, the periphery of each resist pad 28 recedes from the boundary 30 of the geometric image of the corresponding mask pad 22. At higher dose levels, the smaller resist pads clear, with the size of the smallest mask pad for which a residue of the corresponding resist pad still remains increasing with dose. Eventually, a dose level is attained at which all the resist pads 28 clear.

Suppose the minimum dose to clear the pad of radius $R_1$ is $D_1$. Then we can say that if regions of the detector at a distance greater than $R_1$ from the center of the pad (projected to wafer level) receive the dose $D_1$, the dose received at the center of the pad due to flare is $D_0$ and accordingly the flare at the center of the resist pad is $D_0/D_1$. If the dose to clear the next larger pad of radius $R_2$ is $D_2$, the flare level at the center of that resist pad is $D_0/D_2$.

For a negative resist, $D_0$ is the minimum dose at which the resist does not clear in the image of a large transparent region of the mask. $D_1$ is the minimum dose at which there is no hole in the resist in the image of the opaque pad 22. The minimum dose at which a developed negative photoresist film does not clear is called "dose to cover".

We define the flare density function $g(x'-x,y'-y; x',y')$ as follows. Suppose in the absence of flare, the light intensity at point $(x',y')$ in the image plane is $I_0(x',y')$. The flare at a point $(x,y)$ in the image plane is the product of $I_0(x',y')$ and $g(x'-x,y'-y; x',y')$ summed over all points $(x',y')$ in the image:

$$F(x,y) = \int\int g(x-x',y-y'; x',y') I_0(x',y') dx' dy' \quad (1)$$

The image $I_0(x',y')$ depends on the mask layout and the imaging system. For the pad features that are considerably greater than the optical wavelength, $I_0(x',y')$ is a close replica of the binary mask function. The binary mask function, $m(x,y)$, assumes the value 1 if the mask is clear at the point $(x,y)$; 0 if the mask is opaque at $(x,y)$. The flare density function $g(x'-x,y'-y; x',y')$ varies slowly as a function of position in the image field, that is, as a function of the arguments $x',y'$ after the semicolon. In this context, field position means the position of a point on the wafer with respect to a reference frame that is fixed on the projection lens at the beginning of the scanning or fixed exposure by which the said point on the wafer is exposed. Typically, the flare function is approximately shift-invariant over distances that are shorter than a millimeter. That is, $g \approx g(x'-x,y'-y)$ if the source point $(x',y')$ and the observation point $(x,y)$ are both confined to a small region of the imaging field. Over distances that are a substantial fraction of the size of the image field, flare depends on the position in the image field, hence a shift invariant representation of the flare density function is not adequate [see: E. Luce et al., "Flare impact on the intrafield CD control for sub-0.25 μm patterning," SPIE Vol. 3679, p. 368-381, Mar. 1999] An object of the preferred embodiment is to characterize the non-shift-invariant dependence of the flare density function on the field position.

In some optical imaging systems, the flare density function is approximately symmetric:

$$g(x-x',y-y'; x',y') \approx g(r; x',y'),$$

where $r=\sqrt{(x-x')^2+(y-y')^2}$. If the image $I_0(x',y')$ is the circularly symmetric and approximately binary image of a circular pad of radius r:

$$I_0(x',y') \approx \begin{cases} 0, & \text{if } \sqrt{x'^2+y'^2} < r \\ 1, & \text{if } \sqrt{x'^2+y'^2} > r \end{cases} \quad (2a)$$

then the flare at the center of the circular image simplifies to:

$$F(r; x',y') = \int g(\rho; x',y') 2\pi\rho \, d\rho \quad (2b)$$

The circularly symmetric flare density function can be obtained by differentiating (2 b) with respect to the radius r of the pad:

$$g(r; x', y') = -\frac{1}{2\pi r}\frac{dF(r; x', y')}{dr} \qquad (3)$$

If $R_2$ is only slightly larger than $R_1$, then $$g\left(\frac{R_1 + R_2}{2}; x', y'\right) = -\frac{1}{\pi(R_1 + R_2)} \cdot \frac{D_0/D_2 - D_0/D_1}{R_2 - R_1} \qquad (4)$$

Figure 6:
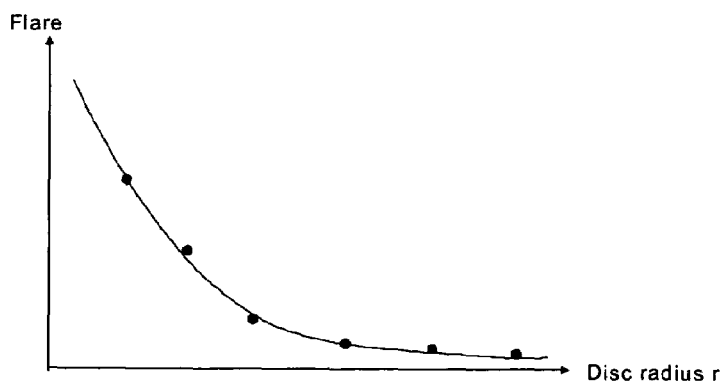
FIG. 6 is a graph illustrating flare measured at the pad center as a function of pad radius.
Figure 7:
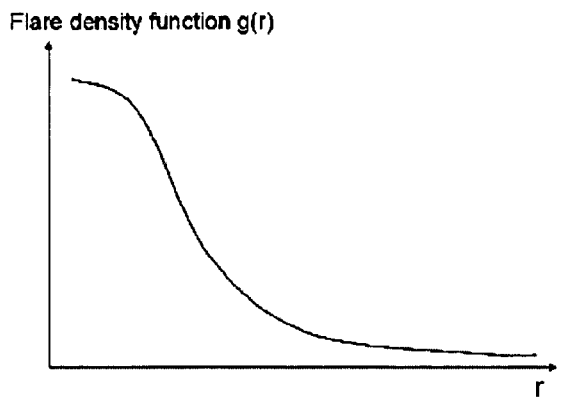
FIG. 7 is a graph of the flare density function.

Thus, by measuring the dose to clear for several closely-spaced values of r (FIG. 6), we can acquire the flare density function g(r; x',y'), without any presumed functional form, as shown in FIG. 7, and this allows us to determine the influence range. Alternatively, a smooth curve with many degrees of freedom, such as a spline, can be fitted to the flare measurements $D_0/D_1$, $D_0/D_2$, ..., $D_0/D_N$ shown in FIG. 6, and g(r) may be obtained from the derivative of the smooth curve.

Figure 1:
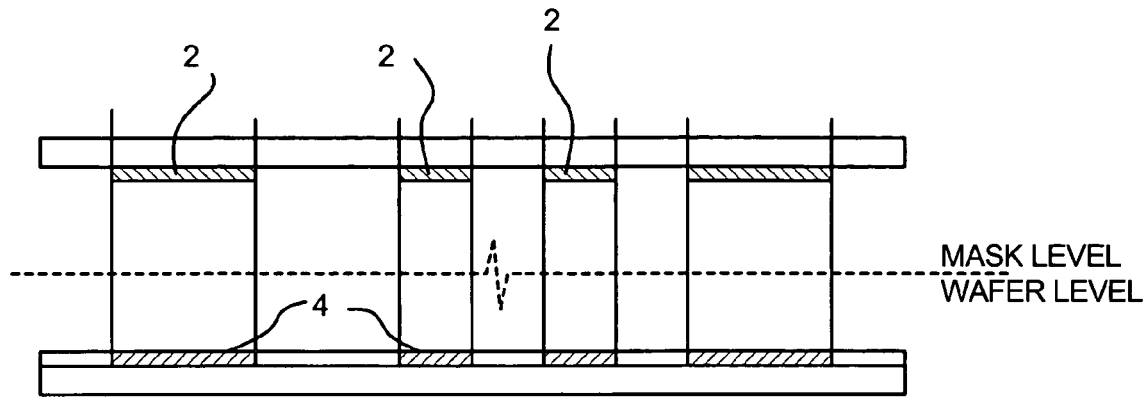
FIG. 1 illustrates imaging of mask features on a resist detector in an optical lithographic system without flare.
Figure 2:
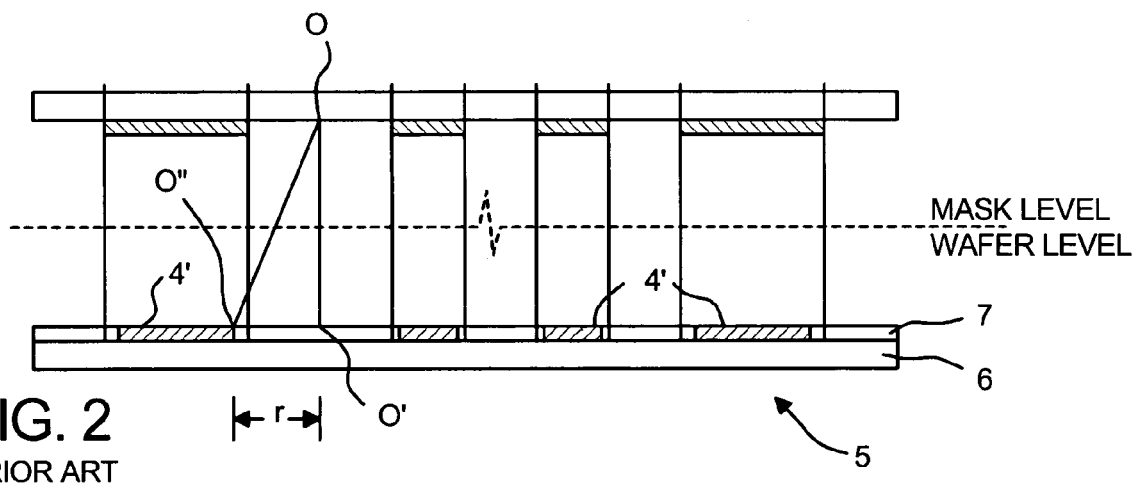
FIG. 2 illustrates imaging of mask features on a resist detector in an optical lithographic system with flare.
Figure 3:
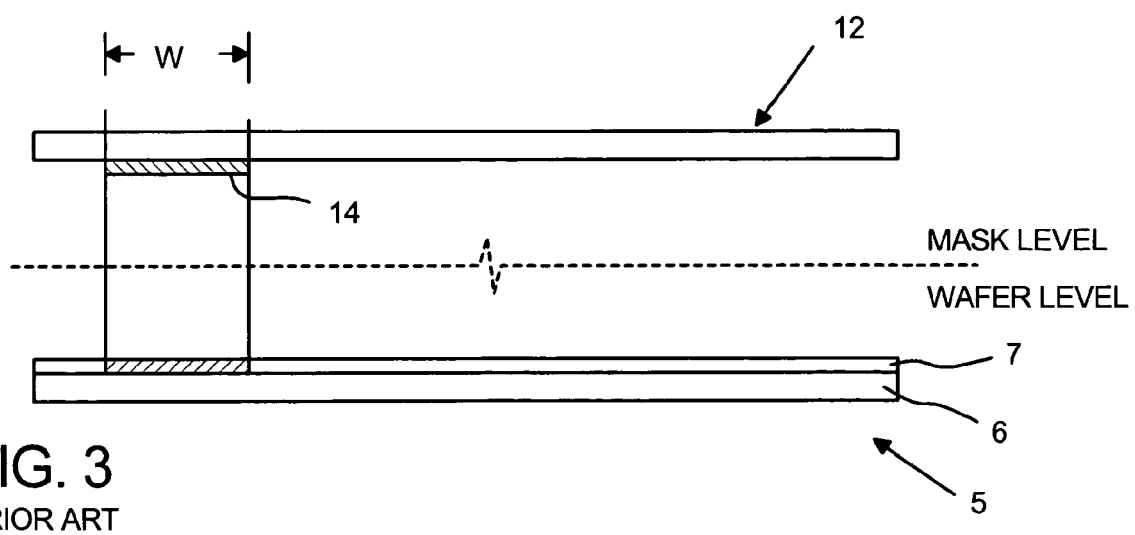
FIG. 3 illustrates imaging of a test structure that includes an opaque feature.
Figure 4:
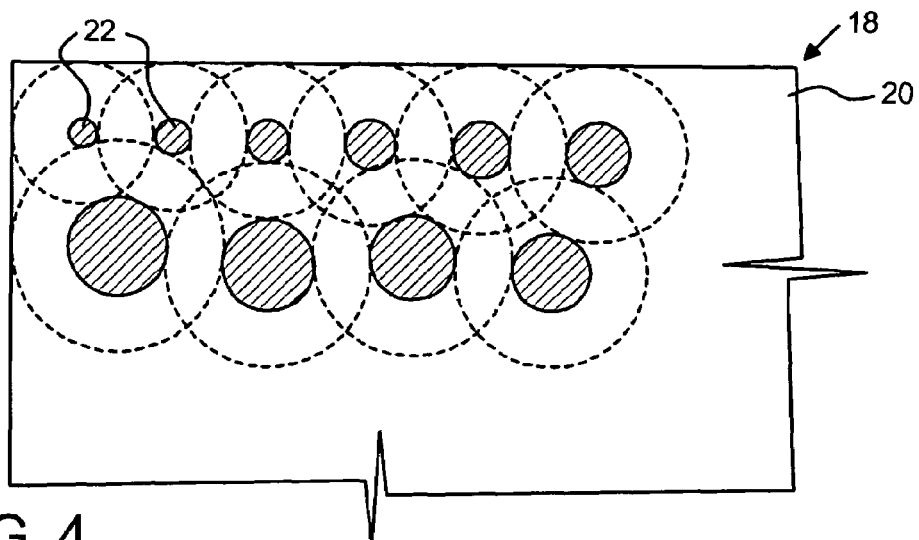
FIG. 4 is a top plan view of a test structure used in a first method embodying the present invention.

The dependence of g on the field position (x',y'), which is implied but not explicitly shown on the right hand side of Equation (4), is obtained by repeating the test structure shown in FIG. 4 at many places in the field. The measurements of dose to clear and the calculation of Equation (4) are repeated at each field location. For example, the field locations can be spaced 2 mm apart along the long dimension of the slit of the stepper-scanner lens.

Medium (field-scale) and long-range (wafer-scale) flare can be measured by the method that is described above and illustrated in FIG. 4. Providing pads larger than the maximum field size (typically 26 mm×33 mm, wafer scale) is not practical. Such large pads can be formed by not exposing the fields in a contiguous area, for example one that approximates a disk at the center of the wafer, and blanketwise exposing all other fields on the wafer. Blanketwise exposure can be achieved either by using a large clear area on a mask or not using a mask and defining an opening with opaque blades at the object plane.

Flare density function can be expressed as a summation of components where each component has a different range of influence:

$$g(r_\perp - r'_\perp, r'_\perp) = \sum_{n=1}^{N} \frac{a_n(r'_\perp)}{2\pi\sigma_n^2(r'_\perp)} \exp\left(-\frac{\|r_\perp - r'_\perp\|^2}{2\sigma_n^2(r'_\perp)}\right) \qquad (5)$$

where $r_\perp=(x,y)$ is an observation point and $r_\perp'=(x',y')$ is a source point in the image plane. The length-scale $\sigma_n(r_\perp')$ and the amplitude $a_n(r_\perp')$ are slowly varying functions of $r_\perp'$, the position of the source point in the image field. Typically, $\sigma_r(r_\perp')$ and $a_n(r_\perp')$ are approximately constant and the flare density function is approximately shift-invariant over distances that are substantially less than one millimeter. An analytic, positive, monotonically decreasing function of $\|r_{\perp-r_\perp'}\|$ can be approximated by the right hand side of (5) for non-negative $a_n(r_\perp')$. With sufficiently many terms in the summation in (5), any circularly symmetric but otherwise arbitrary flare density function can be represented. A more general form of (5) represents flare density functions that are not circularly symmetric:

$$g(r_\perp - r'_\perp, r'_\perp) = \sum_m \sum_n a_{m,n}(x', y') f\left(\frac{x-x'}{l_{x,m}}, \frac{y-y'}{l_{y,n}}\right) \qquad (6)$$

Where the $(m,n)^{th}$ component has amplitude $a_{m,n}$, and influence ranges $l_{x,m}$ and $l_{y,n}$ along the x and y axes, respectively. The function $f(.,.)$ is an analytic, non-negative, decreasing function of two variables that tends to zero at infinity. Multiple, scaled versions of the Gaussian in (5) or $f(.,.)$ in (6) constitute a set of basis functions in which the flare density function is expanded. The basis is generally not orthogonal. The components of the flare density function can be grouped into short, medium, and long-range components of the density functions:

$$g(x-x',y-y'; x',y') = g_{SHORT}(x-x',y-y'; x',y') + g_{MEDIUM}(x-x',y-y'; x',y') + g_{LONG}(x-x',y-y'; x',y') \qquad (7)$$

The design of the test structure 18 has two conflicting preferences:
(i) One of the objectives of the preferred embodiment is to determine the flare density as a function of position in the image field. This argues for placing pads 22 in test structure 18 in close proximity of each other so that the flare density function is approximately shift invariant over the test structure 18.
(ii) On the other hand, the flare measurements can be interpreted by the simple equation (4) only if the environments of all pads 22 are identical within the range of influence of each flare component. This argues for (ii) separating the pads 22 by more than the largest range of influence of all flare components.

Two alternatives for resolving the conflict between the design preferences (i) and (ii) are described in embodiments A and B below.

Embodiment A

Preferred embodiment A abandons interpreting the measurements according to the simple equation (4). When flare is measured as a function of a length parameter, such as the diameter of pads 22 in FIG. 4, each flare measurement may be influenced by more than one component of flare. In this case, the amplitudes in (5) can be determined by solving the following linear equation in the least-square sense.

$$(\text{Flare Measurement})_m = \sum_n A_{mn} a_n \qquad (8)$$

The entries $A_{mn}$ of the coefficient matrix are:

$$A_{mn} = \int\int \frac{I_{0,m}(r'_\perp)}{2\pi\sigma_n^2(r'_\perp)} \exp\left(-\frac{\|r_\perp - r'_\perp\|^2}{2\sigma_n^2(r'_\perp)}\right) dr'_\perp \qquad (9)$$

$I_{0,m}(r_\perp')$ is the intensity at the image plane in the absence of flare for the $m^{th}$ flare measurement. The index m labels the measurements, and the index n labels the components of flare in equations (8) and (9). Equation (8) can be solved in the least-squares sense, with regularization, for example by using the singular-value decomposition of the coefficient matrix A [see: G. Golub and van Loan, Matrix Computations, Ch. 2, 3$^{rd}$ Ed., John Hopkins University Press, 1996].

Embodiment A is not limited to test patterns with round or polygonal pads. It can handle arbitrary test patterns. Embodiment A is not limited to a Gaussian basis set shown in Equation (9). The Gaussian function in (9) can be replaced by any basis function such as the one in Equation (6).

Embodiment B

Embodiment B relies on the simple Equation (4) except that it first subtracts the influence of the surrounding pads from each flare measurement. This is done recursively in a bootstrapping algorithm. First the longest-range flare components are measured using a pads that are larger than the region of influence of other flare components. Next, the flare that is measured by smaller pads is corrected for the influence of the surrounding features according to the flare density function determined in the previous step. The flare density function progressively acquires detail about shorter range components. In the following algorithm, $F_N$, $F_{N-1}$, ..., $F_1$ denote the flare measurements (ratios $D_0/D_N$, $D_0/D_{N-1}$, ..., $D_0/D_1$) at locations $r_\perp^{(N)}$, $r_\perp^{(N-1)}$, ..., $r_\perp^{(1)}$ which are the centers of pads of radius $R_N > R_{N-1} > \ldots > R_1$. The function $I_{0,n}(r_\perp')$ is the intensity distribution at the image plane in the case of the n$^{th}$ flare measurement, in the absence of flare.

$$\tilde{F}_N = F_N$$

$$\tilde{F}_{N-1} = F_{N-1}$$

for $n = N - 1, N - 2, \ldots, 1$ $$g\left(\frac{R_n + R_{n+1}}{2}\right) = \frac{1}{\pi(R_n + R_{n+1})} \frac{\tilde{F}_n - \tilde{F}_{n+1}}{R_{n+1} - R_n}$$

$$\tilde{F}_{n-1} = F_{n-1}(r_\perp^{(n-1)}) - \int\int_{\|r_\perp^{(n-1)} - r_\perp'\| > (R_n + R_{n+1})/2} g(r_\perp^{(n-1)} - r_\perp') I_{0,n-1}(r_\perp') dr_\perp'$$

end for

The first two flare measurements $F_N, F_{N-1}$, are only influenced by the longest-range flare component. The algorithm forms the compensated flare, $\tilde{F}_{n-1}$, by subtracting the effect of the surrounding features from the flare measurement $F_{n-1}$. The distance between the (n−1)$^{th}$ pad and the nearest feature exceeds $(R_n + R_{n+1})/2$. Therefore, flare density function is evaluated only in the range it has been formed up to step n when computing the flare due to the features surrounding the (n−1)$^{th}$ pad. Embodiment B amounts to solving Equation (8) recursively and it is generally less robust the least-squares solution in Embodiment A.

Flare-Meter Based on Critical Dimension Metrology

Figure 8:
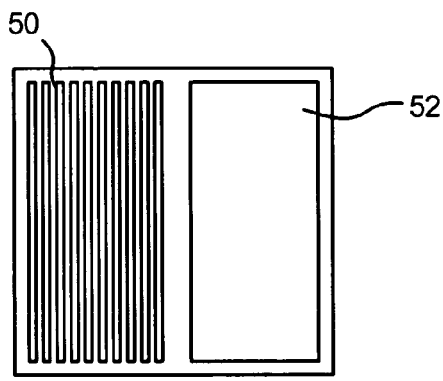
FIG. 8 illustrates schematically a mask used in a second method embodying the present invention.
Figure 9A:
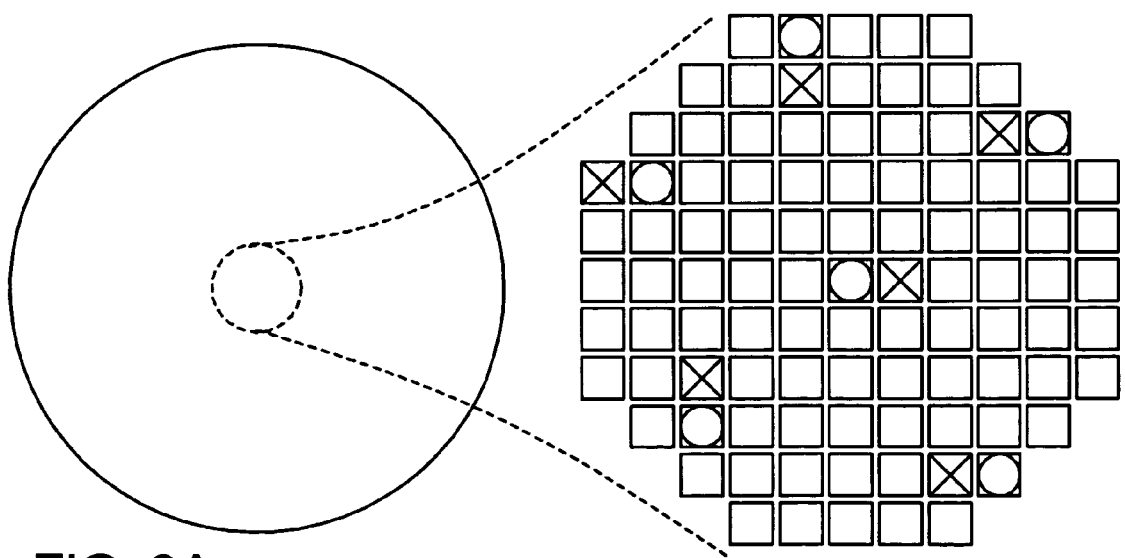
FIG. 9A illustrates schematically a first photoresist detector used in the second method embodying the present invention and shows at the left of the Figure a plan view of the entire wafer and at the right an enlarged view of a central region of the wafer.
Figure 9B:
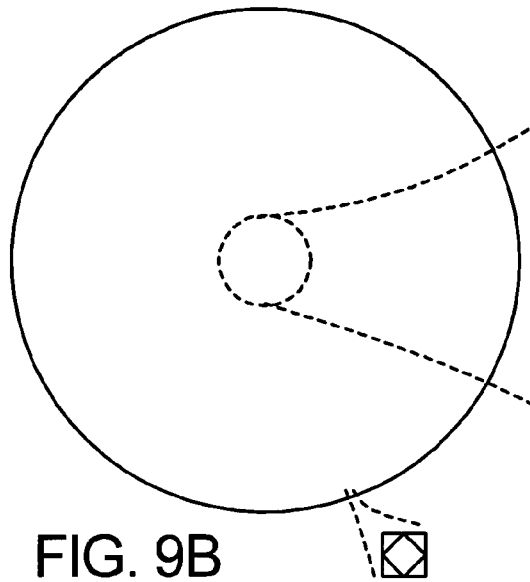
FIG. 9B is a similar illustration of a second photoresist detector used in the second method embodying the present invention.
Figure 9B:
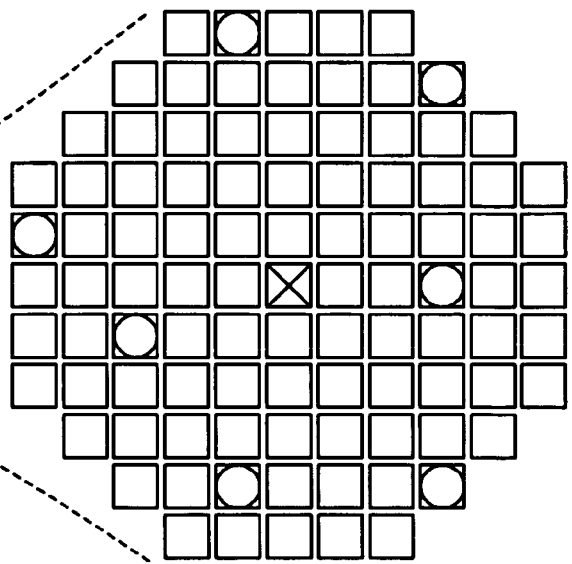

Referring to FIGS. 8, 9A and 9B, a differential technique for measuring flare involves a double exposure technique. FIG. 8 illustrates a mask in which the left of the mask defines a pattern 50 of lines and the right side contains an unpatterned, transparent area 52. Alternatively, patterns 50 and 52 can be on different masks. The lines 50 at the left side of the mask may be of varying width and spacing, from dense to relatively isolated. At the first step, all exposure fields on a first wafer (FIG. 9A) and a second wafer (FIG. 9B) are imagewise exposed using the left side of the mask and blocking the right side of the mask with an opaque blade. The same dose D is used for each of these exposures. At the second step, a subset $\{S_i\}$ of the fields on the first wafer is defined and the fields of the subset, represented schematically in FIG. 9A by the fields marked by crossed lines, are exposed using different respective doses $D_i$ using the aperture on the right side of the mask. Thus, the exposure in the second step is uniform over the exposure fields $\{S_i\}$, as distinct from the imagewise exposure of the first step. The second exposure is an artificially introduced, calibrated flare of dose $D_i$. The doses $D_i$ are typically less than the dose D of the first exposure. The fields $\{S_i\}$ of the subset are preferably spaced from each other on the first wafer by more than one field that is not a member of the subset $\{S_i\}$. After the second exposure, the photoresist is developed. Critical dimensions of the photoresist pattern are then measured at least at each of the fields $\{S_i\}$. The critical dimensions can be measured by a CD_SEM (scanning electron microscope), optical scatterometer.

In a preferred embodiment, the resist pattern is etched into a conductive layer on the wafer, such as doped poly-silicon, and critical dimensions are electrically measured. The difference between the critical dimensions CD($D_i$) for a field $S_i$ that receives a second exposure and a nearby field that is not a member of the subset (fields marked in FIG. 9A with circles) is due to the second exposure at $S_i$. The impact of flare emanating from the field $S_i$ on the nearby field is negligible compared to the impact of the second exposure on field $S_i$. For each field $S_i$, we calculate the difference $\delta CD(D_i) = CD(D_i) - CD_0$, where $CD_0$ is a value of the critical dimensions calculated for the adjacent field, and we fit a smooth function to the differences $\{(\delta CD, D_i) i = 1 \ldots n\}$. The resulting function is an empirical calibration curve that maps CD changes to flare.

At the third step, the center field S(0,0) of the second wafer (marked with crossed lines in FIG. 9B) is blanketwise exposed using the right side of the mask shown in FIG. 8, producing flare at all the other fields, where the line critical dimensions CD are measured. Differences between the critical dimensions CD(x,y) for an outer field S(x,y) and $CD_{ref}$ at a reference field $S_{ref}$ (marked with a diamond in FIG. 9B) at the periphery of the second wafer is due to the flare emanating from the center field; and due to process variations across the second wafer. For each outer field S(x,y) we calculate the difference $\delta CD(x,y) = CD(x,y) - CD_{ref}$. The difference $\delta CD(x,y)$ can be mapped to a flare level F(x,y) using the calibration function derived from the first wafer.

Figure 9C:
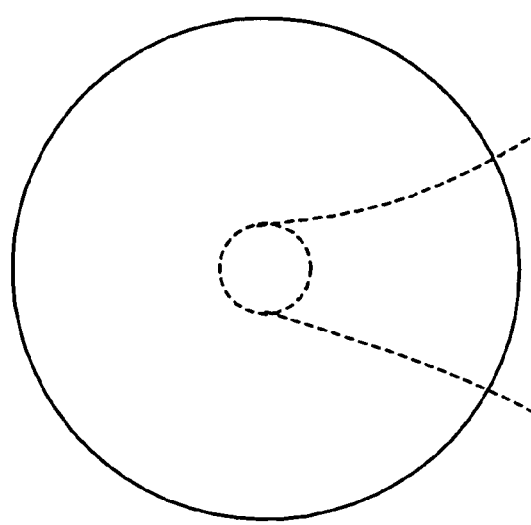
FIG. 9C is a similar illustration of a third photoresist detector that may be used in a further development of the second method embodying the present invention.
Figure 9C:
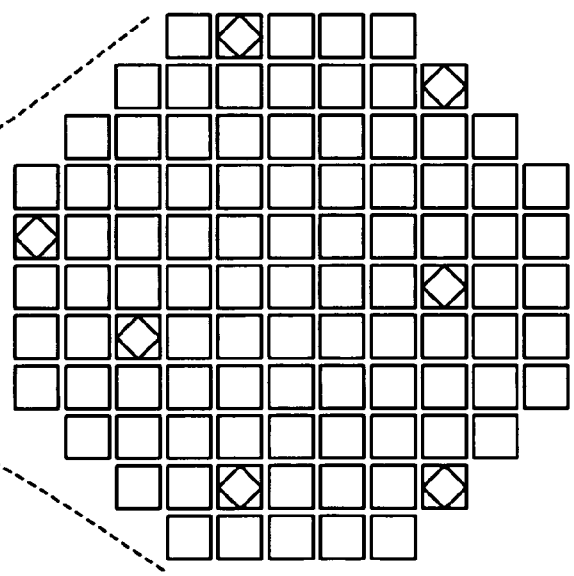

Referring to FIG. 9C, a variation to the above differential technique involves a third reference wafer, which is imagewise exposed using the left side of the mask shown in FIG. 8, employing a blade to block the right side of the mask. The line critical dimension $CD_{ref}(x,y)$ are measured for each field $S_{ref}(x,y)$ of the third wafer. Differences between the critical dimensions CD(x,y) for field S(x,y) on the second wafer and $CD_{ref}(x,y)$ for the corresponding reference field $S_{ref}(x,y)$ on the third wafer (marked with diamonds in FIG. 9C) is due to the flare emanating from the center field of the second wafer; and due to wafer-to-wafer process variations. For each outer field S(x,y) we calculate the difference $\delta CD(x,y) = CD(x,y) - CD_{ref}(x,y)$. The difference $\delta CD(x,y)$ can be mapped to a flare level F(x,y) using the calibration function derived from the first wafer.

The differential measurement technique described with reference to FIGS. 8, 9A and 9B can be used to measure long, medium and short-range flare using photoresist detectors. This technique is preferred for long and medium-range (wafer and field-scale) flare, because the circular pads described with reference to FIGS. 4 and 5, if sufficiently large to measure medium or long-range flare, would be too large to fit onto a single mask.

The test structure shown in FIG. 8 and the test structure shown in FIG. 4 may be provided on a single photomask, thus allowing short, medium and long-range flare to be measured with the same mask though selective exposures. Thus, if the test structure shown in FIG. 4 is provided in one area of the mask and the test structure shown in FIG. 8 is provided in another area of the mask, different fields of a wafer can be exposed to different patterns, employing blades to select the pattern, allowing both techniques to be applied to a single wafer in a single sequence of exposures.

Alternative Embodiments

Figure 10:
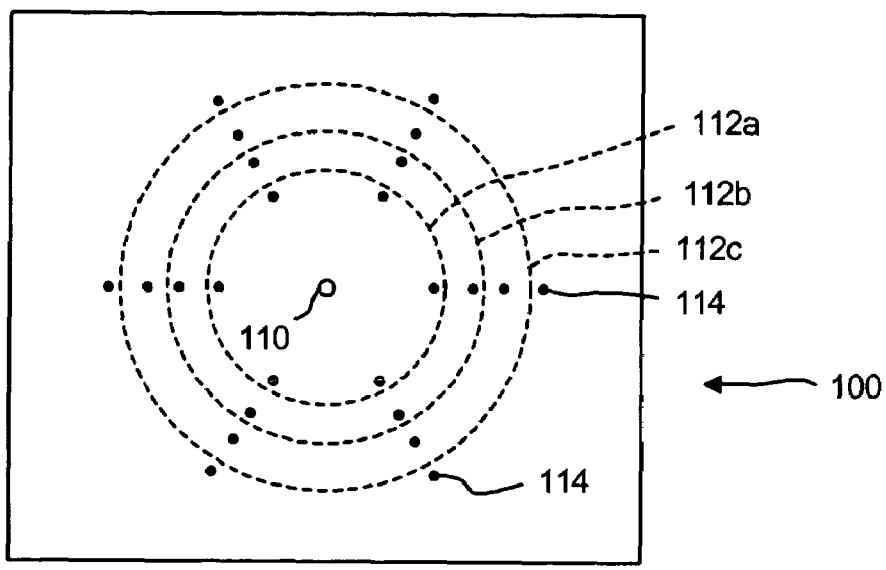
FIG. 10 illustrates a test structure used in a third method embodying the present invention.

Referring to FIG. 10, flare of a selected species can be characterized using a test structure 100 that comprises a transparent plate and a layer of opaque material, such as a chromium film deposited on a fused silica plate. The opaque material is formed with a hole 110 that is much smaller than the influence range of the flare to be studied. Multiple exposures are made at different sites of a positive photoresist detector with different respective doses. For each exposure, after development of the detector there is a hole in the photoresist and the hole expands as the dose increases, as indicated by the broken line 112 depictions in FIG. 10. Line 112a indicates the edge (contour) of the developed photoresist corresponding to exposure dose $D_a$. At exposure a, the photoresist would receive the dose $D_a$ if the mask were transparent. Line 112b, 112c, . . . correspond to exposure $D_b, D_c, \ldots$, respectively. The clearing dose $D_0$ for the resist is the smallest dose at which a hole is formed in the resist after development. The dose at the edge 112n of photoresist is always equal to $D_0$. Therefore, edge 112n is an equal-level contour of the flare density function:

for (x,y)∈Contour 112n, $$g(x-x', y-y') = \frac{D_0}{D_n \int\int I_{0,n}(x'', y'') dx'' dy''}; \qquad (10)$$

In Equation 10, (x,y) is a point on the resist edge 112n, (x',y') is the center of the hole 110, and $I_{0,n}$ is the intensity distribution in the image plane, in the absence of flare, for unit exposure dose. The integral in the denominator of Equation (10) is approximately equal to the area of the geometric image of hole 110 if the hole is substantially larger than the diffraction limited resolution of the imaging system and smaller than the distance from the center (x',y') to the resist edge 112. Thus, the values of flare density function can be obtained on contours 112 without any presumed functional form. Well known techniques of interpolation from an irregular grid allow interpolation of the flare density function to any point in between contours 112 [see: griddata.m function of MATLAB, rev. 5.33, The MathWorks, Inc., Natick, Mass. 2002].

Although the technique described with reference to FIG. 10 can be used with a photoresist detector, it is particularly preferred for flare measurements employing a photodetector 114 or an array of photodetectors such as a charge coupled device (CCD) detector array, which may be at the locations indicated by the solid dots 114 in FIG. 10 and allow detection of low flare intensity at a position far from the hole. The photodetectors 114 are located in the image plane of the optical system, preferably at the wafer stage; whereas, the test pattern 100 with hole 110 on the test mask is located in the object plane of the lithography projector. The flared image of hole 110 falls on the detector(s) 114. It is adventageous to block the geometric image of hole 110 on the detector by a small opaque absorbing baffle in order to prevent blooming in the detector array.

As noted above, flare may be asymmetrical with regard to both location and direction. Management of flare would be aided by the ability to characterize the asymmetry of the flare.

Figure 11A:
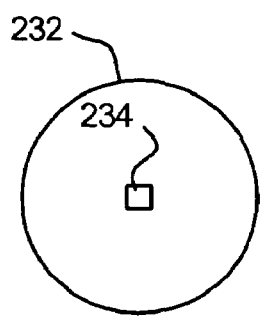
FIG. 11A illustrates a test structure that may be used in a fourth method embodying the invention.
Figure 11B:
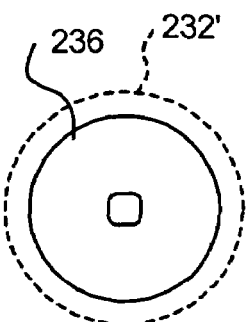
FIGS. 11B and 11C illustrate a photoresist detector after use of the FIG. 11A test structure in an optical lithography system with symmetrical flare and in an optical lithography system with asymmetrical flare.
Figure 11C:
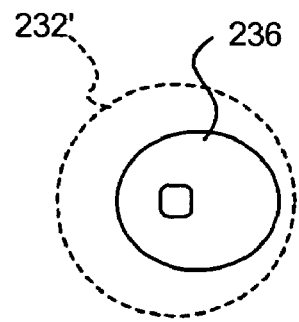

Referring to FIG. 11, flare asymmetry may be characterized using a test structure that consists of a circular opaque disc 232 with a feature 234 at a known reference position relative to the periphery of the disc, e.g. at the center of the disc. The feature that defines the reference position is preferably a single rectangular hole, as shown in FIG. 11A, but it may alternatively be a hole of a different shape, including a cross, or multiple holes, such as two linear slots. The test structure is installed in the stepper and the stepper is used to expose numerous sites on a photoresist detector at different respective exposure doses. In FIGS. 11B and 11C, the geometric boundary of the disc 232, projected onto the detector, is denoted by the dashed line 232'. As exposure level increases, the resist boundary 236 that corresponds to the periphery of the disc recedes from the geometric boundary 232' of the disc due to the influence of flare. If the flare is symmetrical, the resist pattern will be symmetrical relative to the image of the center feature 234, as shown in FIG. 11B. If the flare is asymmetrical, the resist pattern will be asymmetrical relative to the image of the center feature. For example, in the case of FIG. 11C there is stronger flare at the left of the field. The degree of asymmetry of the flare can be characterized by the degree of asymmetry of the resist pattern.

The flare asymmetry can also be directly characterized with the flare density function g(x−x',y−y'; x',y') obtained using the test structure described with reference to FIG. 10. In the case that flare is symmetrical, g(x−x',y−y'; x',y')=g(r; x',y'), where r=sqrt[$(x-x')^2 + (y-y')^2$].

In a lithographic system, a considerable amount of flare can be caused by contamination of the lens. Thus, flare level is a good indicator of the degree of lens contamination. The techniques described above for characterizing flare can be used as part of the cleaning and maintenance procedure for a photolithography system. Thus, the flare is measured periodically using the techniques described above and the measured flare is compared with a predetermined threshold. In the event that the measured flare exceeds the threshold, this is taken as an indication that the optical system requires maintenance or cleaning.

Flare may degrade performance of an optical lithography system and, in particular, may increase variation in CD across the field and across the wafer. Consequently, the features of the mask are not accurately transferred to the wafer. The techniques described above for measuring flare can be used in OPC applications to reduce variations in CD across the field and across the wafer and thereby improve image fidelity.

Long-range flare causes variations in CD across the wafer. The long-range flare dose at each field is calculated based on the flare density function and the mask layout. It is then possible to calculate an adjusted dose for each field that will reduce, image degradation due to long-range flare.

Medium and short-range flare may cause variations in CD across the field. The CD variations due to medium and short-range flare can be calculated for different locations in the field. It is then possible to adjust the mask layout, for example by employing different lithography models or design rules depending on location in the field, to compensate for the variations in CD and thereby minimize, or at least reduce, image degradation due to medium and short-range flare.

The techniques that have been described herein for measuring or characterizing flare are not limited to a particular lithography technique and are thus applicable to projection lithography in general. The actinic radiation can refer to light such as UV, EUV, X-ray radiation, or a particle beam such as an electron beam. Projecting an image of the exposure mask can involve transmitting radiation through the mask or reflecting radiation from the mask. The mask may be reflective and it could be a spatial light modulator of a maskless-lithography instrument, which is typically a micro-machined array of mirrors [see: Chang et al., High-resolution maskless lithography, Journal of Microlithography, Microfabrication, and Microsystems 02(04), p. 331-339, 2003]. Hence "illuminating the sensitive surface of the exposure target through the exposure mask" is understood to be not limited to transmission of illumination through the mask. It is understood to include any interaction between the illumination and the mask.

It will be appreciated that the invention is not restricted to the particular embodiment that has been described, and that variations may be made therein without departing from the scope of the invention as defined in the appended claims and equivalents thereof. For example, although circular pads are used for measuring flare by the method described with reference to FIGS. 4 and 5, the invention is not restricted to use of circular pads and polygonal pads having rotational symmetry of sufficient order to approximate circular pads, e.g. order greater than four, may be employed instead.

Figure 12:
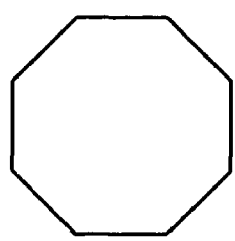
FIG. 12 illustrates an alternative form of mask pad that may be used in the first method embodying the present invention.

An object has rotational symmetry of order n if it is invariant under a rotation by $2\pi/n$ radians. It will be appreciated that polygonal pads, such as the octagonal pad illustrated in FIG. 12, may afford the advantage of being easier to manufacture than circular pads. It will also be understood that a reference in the context of the invention to a feature having rotational symmetry is not intended to exclude the possibility of a minor departure from exact rotational symmetry. In the context of the method described with reference to FIGS. 4-7, ideally the pads would be circular but it is intended that the relevant claims should cover approximations to circular configuration. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. A method of measuring flare in an optical lithographic system having a source that emits actinic radiation, comprising:
   a. providing an exposure mask that comprises at least first and second discrete features of a first opacity characteristic in a field of a second opacity characteristic, wherein the first and second features each have rotational symmetry of order greater than four and are of different respective areas, the first opacity characteristic is substantially complete opacity and the second opacity characteristic is substantially complete transparency,
   b. providing an exposure target having a surface that is sensitive to actinic radiation,
   c. positioning the exposure mask and the exposure target in the lithographic system such that actinic radiation emitted by the lithographic system illuminates the sensitive surface of the exposure target through the exposure mask, whereby each feature of the exposure mask projects a geometric image on the sensitive surface of the exposure target,
   d. employing the optical lithographic system to emit a dose of actinic radiation, and
   e. measuring the extent to which regions of the sensitive surface that are within the geometric image of a feature of the exposure mask are exposed to actinic radiation during step d due to flare.

2. A method according to claim 1, wherein the first pad is larger than the second pad and the method comprises exposing multiple sites of the exposure target at different respective doses and determining dose to clear for the first and second pads.

3. A method according to claim 1, wherein step c comprises:
   c1. relatively positioning the exposure mask and the exposure target for exposing a first exposure site of the exposure target,
   step d comprises:
   d1. employing the optical lithographic system to emit a first dose of radiation for exposing the first exposure site,
   and the method further comprises, between steps d and e:
   c2. relatively positioning the exposure mask and the exposure target for exposing a second exposure site of the exposure target, and
   d2. employing the optical lithographic system to emit a second dose of radiation for exposing the second exposure site, wherein the second dose is different from the first dose.

4. A method according to claim 3, wherein the first and second features are opaque pads and the field is substantially transparent and step e comprises:
   measuring the extent to which regions of the sensitive surface that are within the geometric image at the first exposure site of a pad of the exposure mask are exposed to actinic radiation during step d due to flare, and
   measuring the extent to which regions of the sensitive surface that are within the geometric image at the second exposure site of a pad of the exposure mask are exposed to actinic radiation during step d due to flare.

5. A method according to claim 4, wherein the exposure target is a photoresist detector having a coating of positive resist, whereby illumination of the sensitive surface of the photoresist detector through the exposure mask creates, at each exposure site, resist pads corresponding respectively to the opaque pads of the exposure mask, and the method comprises determining a first dose to clear a resist pad corresponding to the first opaque pad, determining a second dose to clear a resist pad corresponding to the second opaque pad, and deriving a flare density function for the optical lithographic system from values of the sizes of the first and second opaque pads and values of the first and second doses to clear.

6. A method according to claim 4, wherein the exposure target is a photoresist detector having a coating of negative resist, whereby illumination of the sensitive surface of the photoresist detector through the exposure mask creates, at each exposure site, openings corresponding respectively to the opaque pads of the exposure mask, and the method comprises determining a first dose to cover an opening corresponding to the first pad, determining a second dose to cover an opening corresponding to the second pad, and deriving a flare density function for the optical lithographic system from values of the sizes of the first and second pads and values of the first and second doses to cover.

7. A method according to claim 1, wherein the first and second features are substantially opaque pads having rotational symmetry of order at least eight.

8. A method according to claim 1, wherein the first and second features are substantially opaque, circular pads.

9. A method according to claim 1, wherein the first and second features of the exposure mask are substantially opaque pads and the field is substantially transparent and the exposure target is a photoresist detector having a coating of positive resist, whereby illumination of the sensitive surface of the photoresist detector through the exposure mask creates, at each exposure site, resist pads corresponding respectively to the openings of the exposure mask, and the method comprises determining a first dose to clear a resist pad corresponding to the first pad, determining a second dose to clear a resist pad corresponding to the second pad, and deriving a flare density function for the optical lithographic system from values of the sizes of the first and second pads and values of the first and second doses to clear.

10. A method according to claim 1, wherein the first and second features of the exposure mask are substantially opaque pads and the field is substantially transparent and the exposure target is a photoresist detector having a coating of negative resist, whereby illumination of the sensitive surface of the photoresist detector through the exposure mask creates, at each exposure site, openings corresponding respectively to the pads of the exposure mask, and the method comprises determining a first dose to cover an opening corresponding to the first pad, determining a second dose to cover an opening corresponding to the second pad, and deriving a flare density function for the optical lithographic system from values of the sizes of the first and second pads and values of the first and second doses to cover.

11. A method of measuring flare asymmetry in an optical lithographic system having a source that emits actinic radiation, comprising:
 a. providing an exposure mask that comprises an opaque pad in a transparent field, wherein the pad has rotational symmetry of order greater than four,
 b. providing an exposure target having a surface that is sensitive to actinic radiation,
 c. positioning the exposure mask and the exposure target in the lithographic system such that actinic radiation emitted by the lithographic system illuminates the sensitive surface of the exposure target through the exposure mask, whereby the opaque pad of the exposure mask projects a geometric image on the sensitive surface of the exposure target,
 d. employing the optical lithographic system to emit a dose of actinic radiation, and
 e. measuring the extent to which regions of the sensitive surface that are within the geometric image of the pad of the exposure mask and are exposed to actinic radiation during step d are asymmetrically positioned relative to the geometric image of the pad.

12. A method according to claim 11, wherein the pad has a reference hole at a predetermined position relative to the periphery of the pad, whereby the geometric image of the pad includes a portion that corresponds to the hole, and step e comprises measuring the positions of said regions of the sensitive surface relative to said portion of the geometric image of the pad.

13. A method according to claim 11, wherein the pad has a central hole, whereby the geometric image of the pad includes a portion that corresponds to the hole, and step e comprises measuring the extent to which said regions of the sensitive surface are asymmetrically positioned relative to said portion of the geometric image of the pad.

14. A method according to claim 13, wherein the hole is substantially square.

15. A method according to claim 11, wherein the opaque pad has rotational symmetry of order at least eight.

16. A method according to claim 11, wherein the opaque pad is circular.

17. A method of characterizing flare in an optical lithographic system having a source that emits actinic radiation, comprising:
 a. providing an exposure target having a surface that is sensitive to actinic radiation,
 b. positioning the exposure target in the lithographic system, wherein the lithographic system resolves the sensitive surface of the exposure target into M+N exposure fields, and
 c. blanketwise exposing N exposure fields on the photosensitive surface of the exposure target to a dose of actinic radiation.

18. A method according to claim 17, wherein the exposure target that is provided in step a is a first exposure target, the dose to which the N fields are exposed in step c is a first dose, and the method further comprises repeating steps a, b and c for a second exposure target and a second dose, different from the first dose.

19. A method according to claim 17, wherein the exposure target that is provided in step a is a first exposure target, the dose to which the N fields are exposed in step c is a first dose, and the method further comprises:
 repeating steps a and b for a second exposure target, and
 blanketwise exposing N+P (where P is less than M) exposure fields on the photosensitive surface of the exposure target to a dose of actinic radiation.

20. A method of characterizing flare in an optical lithographic system that emits actinic radiation, comprising:
 a. providing a first exposure target having a surface that is sensitive to actinic radiation,
 b. providing an exposure mask that defines pattern features,
 c. imagewise exposing first, second, third and fourth exposure sites of the first exposure target through the exposure mask to actinic radiation emitted by the lithographic system, whereby the pattern features of the exposure mask project respective geometric images at said first, second, third and fourth sites,
 d. blanketwise exposing the second and fourth sites of the first exposure target to actinic radiation emitted by the lithographic system at different respective doses,
 e. measuring critical dimensions of the patterns recorded at the first, second, third and fourth sites,
 f. providing a second exposure target having a surface that is sensitive to actinic radiation,
 g. imagewise exposing first and second exposure sites of the second exposure target through the exposure mask to actinic radiation emitted by the lithographic system, whereby the pattern features of the exposure mask project respective geometric images at said first and second sites of the second exposure target, h. blanketwise exposing a third exposure site of the second exposure target to actinic radiation emitted by the lithographic system, wherein the third site of the second exposure target is at substantially a maximum possible distance from the second site, and i. measuring critical dimensions of the patterns recorded at the first and second sites of the second exposure target.

21. A method according to claim 20, wherein the exposure mask has a first region that contains said pattern features and a second region that is unpatterned, and step c comprises blocking the second region and step d comprises blocking the first region.

22. A method according to claim 20, wherein the exposure mask has a first region that contains said pattern features and a second region that comprises at least first and second discrete opaque features in a transparent field, the first and second features each have rotational symmetry of order greater than four and are of different respective areas, step c comprises blocking the second region, and the method further comprises:

j. imagewise exposing at least one field of at least one of the exposure targets through the second region of the exposure mask while blocking the first region, whereby the first and second discrete features project respective geometric images at said one field.

23. A method according to claim 20, further comprising calculating a difference in critical dimensions between the first and second exposure sites of the second exposure target.

24. A method according to claim 20, wherein step e further comprises:

e1. calculating a difference in critical dimensions between the first site and the second site, e2. calculating a difference in critical dimensions between the third site and the fourth site, and e3. associating the differences calculated in steps e1 and e2 with the doses at which the second and fourth sites were exposed in step d.

25. A method according to claim 24, wherein step c comprises imagewise exposing fifth and sixth exposure site of the first exposure target, step d comprises blanketwise exposing the sixth site of the first exposure target to actinic radiation emitted by the lithographic system at a different dose from the doses to which the second and fourth sites are exposed in step d, step e comprises measuring critical dimensions of the patterns recorded at the fifth and sixth sites, calculating a difference in critical dimensions between the fifth field and the sixth field, associating the calculated difference between the fifth field and the sixth field with the dose at which the sixth field was exposed in step d, and deriving a smooth function of dose that fits the calculated differences and the associated doses.

26. A method according to claim 25, further comprising:

j. calculating a difference between the critical dimensions measured in step i, k. calculating flare dose or flare level at the first exposure site of the second exposure target by employing the difference calculated in step j as a variable in said smooth function.

27. A method according to claim 26, further comprising deriving a flare density function from values of flare level.

28. A method according to claim 11, comprising deriving a flare density function from the measurements made in steps e and i.

29. A method according to claim 11, wherein the first exposure target is composed of two mutually exclusive sets of exposure sites, each site of the second set neighbors a single site of the first set and is more remote from the other sites of the first set, step c comprises imagewise exposing the exposure sites of both the first set and the second set, step d comprises blanketwise exposing the sites of the first set at different respective doses, step e comprises measuring critical dimensions of the patterns recorded at all of the sites of the first and second sets, and the method further comprises:

calculating a difference in critical dimensions between each site of the second set and the single neighbor site of the first set, and deriving a smooth function of dose that relates the calculated differences as dependent variable and the associated doses as independent variable.

30. A method according to claim 11, wherein the third exposure site of the second exposure target is a central exposure site, the second exposure target is composed of a plurality of first exposure sites, the second exposure site and the third exposure site, step g comprises imagewise exposing said first exposure sites and said second exposure site, step i comprises measuring critical dimensions of the patterns recorded at said second site and at each of said first sites, and the method further comprises:

calculating a difference in critical dimensions between each of said first sites and the second site, and employing a function that relates difference in critical dimensions as dependent variable and the dose as independent variable to calculate, for a plurality of said first sites, flare dose or dose level.

31. A method of characterizing flare in an optical lithographic system that emits actinic radiation, comprising:

a. providing a first exposure target having a surface that is sensitive to actinic radiation, b. providing an exposure mask that defines pattern features, c. imagewise exposing first, second, third and fourth exposure sites of the first exposure target through the exposure mask to actinic radiation emitted by the lithographic system, whereby the pattern features of the exposure mask project respective geometric images at said first, second, third and fourth sites, d. blanketwise exposing the second and fourth sites of the first exposure target to actinic radiation emitted by the lithographic system at different respective doses, e. measuring critical dimensions of the patterns recorded at the first, second, third and fourth sites, f. providing a second exposure target having a surface that is sensitive to actinic radiation, g. imagewise exposing a first exposure site of the second exposure target through the exposure mask to actinic radiation emitted by the lithographic system, whereby the pattern features of the exposure mask project a geometric image at said first site of the second exposure target, h. blanketwise exposing the second exposure site of the second exposure target to actinic radiation emitted by the lithographic system, i. measuring critical dimensions of the pattern recorded at the first site of the second exposure target, j. providing a third exposure target, k. imagewise exposing a first exposure site of the third exposure target through the exposure mask to actinic radiation emitted by the lithographic system, whereby the pattern features of the exposure mask project a geometric image at said first exposure site of the third exposure target, wherein the first exposure site of the third exposure target corresponds in position to the first exposure site of the second exposure target, and l. measuring critical dimensions of the pattern recorded at the first exposure site of the third exposure target.

32. A method according to claim 31, wherein the exposure mask has a first region that contains said pattern features and a second region that is unpatterned, and step c comprises blocking the second region and step d comprises blocking the first region.

33. A method according to claim 31, wherein the exposure mask has a first region that contains said pattern features and a second region that comprises at least first and second discrete opaque features in a transparent field, the first and second features each have rotational symmetry of order greater than four and are of different respective areas, step c comprises blocking the second region, and the method further comprises:
   j. imagewise exposing at least one field of at least one of the exposure targets through the second region of the exposure mask while blocking the first region, whereby the first and second discrete features project respective geometric images at said one field.

34. A method according to claim 31, further comprising calculating a difference in critical dimensions between the first exposure site of the third exposure target and the first exposure site of the second target.

35. A method according to claim 31, wherein
   step g comprises imagewise exposing a plurality of first exposure sites of the second exposure target,
   step i comprises measuring critical dimensions of the patterns recorded at the first exposure sites of the second exposure target,
   step k comprises imagewise exposing a plurality of first sites of the third exposure target, wherein the first exposure sues of the third exposure target correspond respectively in position to the first exposure sites of the second exposure target,
   step l comprises measuring critical dimensions of the patterns recorded at the first exposure sites of the third exposure target, and
   the method further comprises calculating differences between the critical dimensions for the first exposure sites of the second exposure target and the corresponding first exposure sites of the third exposure target.

36. A method according to claim 31, wherein step e further comprises:
   e1. calculating a difference in critical dimensions between the first site and the second site,
   e2. calculating a difference in critical dimensions between the third site and the fourth site, and
   e3. associating the differences calculated in steps e1 and e2 with the doses at which the second and fourth sites were exposed in step d.

37. A method according to claim 31, wherein step c comprises imagewise exposing fifth and sixth exposure site of the first exposure target, step d comprises blanketwise exposing the sixth site of the first exposure target to actinic radiation emitted by the lithographic system at a different dose from the doses to which the second and fourth sites are exposed in step d, step e comprises measuring critical dimensions of the patterns recorded at the fifth and sixth sites, calculating a difference in critical dimensions between the fifth field and the sixth field, associating the calculated difference between the fifth field and the sixth field with the dose at which the sixth field was exposed in step d, and deriving a smooth function of dose that fits the calculated differences and the associated doses.

38. A method according to claim 37, further comprising:
   j. calculating a difference between the critical dimensions measured in step i,
   k. calculating flare dose or flare level at the first exposure site of the second exposure target by employing the difference calculated in step j as a variable in said smooth function.

39. A method according to claim 38, further comprising deriving a flare density function from values of flare level.

40. A method according to claim 31, comprising deriving a flare density function from the measurements made in steps e and i.

41. A method according to claim 31, wherein the first exposure target is composed of two mutually exclusive sets of exposure sites, each site of the second set neighbors a single site of the first set and is more remote from the other sites of the first set, step c comprises imagewise exposing the exposure sites of both the first set and the second set, step d comprises blanketwise exposing the sites of the first set at different respective doses, step e comprises measuring critical dimensions of the patterns recorded at all of the sites of the first and second sets, and the method further comprises:
   calculating a difference in critical dimensions between each site of the second set and the single neighbor site of the first set, and
   deriving a smooth function of dose that relates the calculated differences as dependent variable and the associated doses as independent variable.

42. A method according to claim 31, wherein the second exposure site of the second exposure target is a central exposure site, the second exposure target is composed of a plurality of first exposure sites and the second exposure site, step g comprises imagewise exposing said first exposure sites, step i comprises measuring critical dimensions of the patterns recorded at each of said first sites, and the method further comprises:
   calculating a difference in critical dimensions between each of said first sites and the corresponding site of the third exposure target, and
   employing a function that replaces difference in critical dimensions as dependent variable and the dose as independent variable to calculate, for a plurality of said first sites, flare dose or dose level.

* * * * *